(12) United States Patent
Kim et al.

(10) Patent No.: US 8,184,468 B2
(45) Date of Patent: May 22, 2012

(54) NONVOLATILE MEMORY DEVICES USING VARIABLE RESISTIVE ELEMENTS

(75) Inventors: Ki-Sung Kim, Seoul (KR); Byung-Gil Choi, Yongin-si (KR); Young-Ran Kim, Suwon-si (KR); Jong-Chul Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 271 days.

(21) Appl. No.: 12/453,529

(22) Filed: May 14, 2009

(65) Prior Publication Data

US 2009/0285009 A1 Nov. 19, 2009

(30) Foreign Application Priority Data

May 19, 2008 (KR) ........................ 10-2008-0046181

(51) Int. Cl.
*G11C 11/00* (2006.01)
(52) U.S. Cl. ........................................ 365/148; 365/163
(58) Field of Classification Search .................. 365/148, 365/163, 185.13, 175, 203, 229
See application file for complete search history.

(56) References Cited

U.S. PATENT DOCUMENTS

| 6,552,949 | B1 * | 4/2003 | Silla et al. ...................... 365/227 |
| 2004/0174728 | A1 * | 9/2004 | Takano et al. .................. 365/145 |
| 2005/0185445 | A1 * | 8/2005 | Osada et al. ................... 365/148 |
| 2007/0058425 | A1 * | 3/2007 | Cho et al. ....................... 365/163 |
| 2007/0217260 | A1 * | 9/2007 | Kitagawa ................. 365/185.05 |
| 2008/0158941 | A1 * | 7/2008 | Choi et al. ..................... 365/163 |

FOREIGN PATENT DOCUMENTS

| JP | 2003-36676 | 2/2003 |
| KR | 10-2004-0019927 | 3/2004 |
| KR | 10-2004-0074088 | 8/2004 |
| KR | 10-2006-0117019 | 11/2006 |

* cited by examiner

*Primary Examiner* — Douglas King
(74) *Attorney, Agent, or Firm* — Harness, Dickey & Pierce, P.L.C.

(57) ABSTRACT

A nonvolatile memory device using a variable resistive element is provided. The nonvolatile memory device may include a memory cell array which includes an array of multiple nonvolatile memory cells having variable resistance levels depending on data stored. Word lines may be coupled with each column of the nonvolatile memory cells. Local bit lines may be coupled with each row of the nonvolatile memory cells. Global bit lines may be selectively coupled with the multiple local bit lines.

5 Claims, 7 Drawing Sheets

NONVOLATILE MEMORY DEVICES USING VARIABLE RESISTIVE ELEMENTS

PRIORITY STATEMENT

This non-provisional U.S. patent application claims priority under 35 U.S.C. §119 to Korean Patent Application No. 10-2008-0046181 filed on May 19, 2008, in the Korean Intellectual Property Office, the entire contents of which are incorporated herein by reference.

BACKGROUND

Description of the Related Art

Conventional nonvolatile memory devices using resistance materials may include PRAM (Phase change Random Access Memory), RRAM (Resistive RAM), and MRAM (Magnetic RAM). Nonvolatile memory devices using resistance materials may store data using phase-change materials such as chalcogenide alloy (PRAM), variable resistive elements (RRAM), and MTJ (Magnetic Tunnel Junction) thin films according to the magnetization state of a ferromagnetic substance.

A phase change memory cell including the phase change material may change into a crystal state or amorphous state by cooling after heating. Since the phase change material in the crystal state has a low resistance and the phase-change material in the amorphous status has a high resistance, the crystal state may be defined as set data 0, and the amorphous state may be defined as reset data 1.

The conventional phase change memory cell may include a variable resistive element containing a phase change material and an access element that controls current that flows through the variable resistive element. A transistor or diode can be used as an access element. The phase change memory cell that uses the transistor as an access element is called a transistor-controlled PRAM cell, and the phase change memory cell that uses diode as an access element is called a diode-controlled PRAM cell.

SUMMARY

Example embodiments provide nonvolatile memory devices with a reduced deep power down current and/or standby current.

At least one example embodiment provides a nonvolatile memory device including: a memory cell array which may have an array of multiple nonvolatile memory cells arranged in rows and columns. The nonvolatile memory cells may have variable resistance levels depending on data stored therein. Word lines may be coupled with the columns of the nonvolatile memory cells. Local bit lines may be coupled with the rows of the nonvolatile memory cells. Global bit lines may be selectively coupled with the local bit lines and have a voltage level other than ground voltage during a deep power down period. A controller may be configured to permit the global bits lines to have a voltage level other than ground voltage during the deep power down period.

According to at least another example embodiment, there is provided a nonvolatile memory device including a memory cell array which may have an array of multiple nonvolatile memory cells arranged in rows and columns. The memory cells may have variable resistance levels depending on data stored therein. Word lines may be coupled with the columns of the nonvolatile memory cells. Local bit lines may be coupled with the rows of the nonvolatile memory cells. Write global bit lines which are used to supply write data to the memory cell array may be selectively coupled with the local bit lines. Read global bit lines which are used to supply read data to the memory cell array may be selectively coupled with the local bit lines. The write global bit lines and the read global bit lines may have different voltage levels than each other during a standby period. A controller may be configured to permit the write global bit lines and the read global bit lines to have different voltage levels than each other during the standby period.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1:
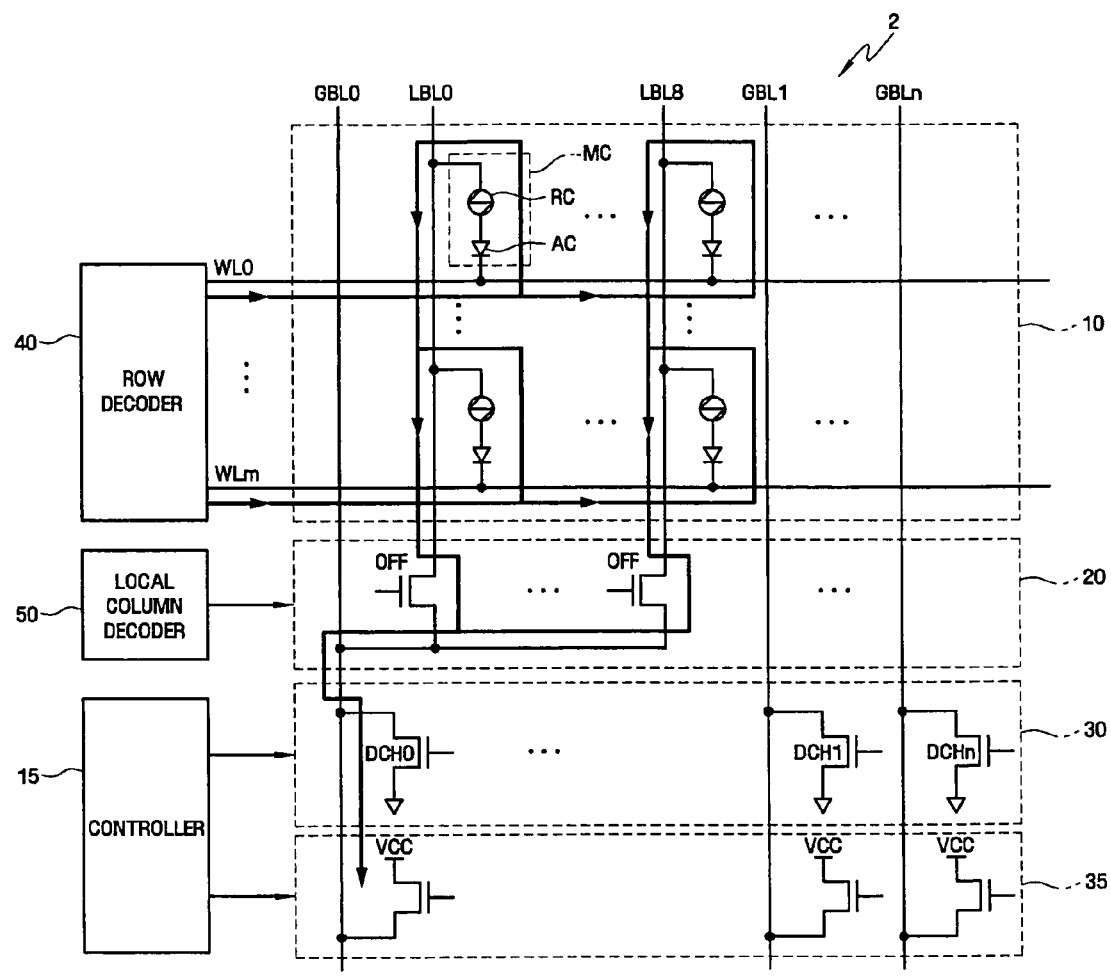
FIG. 1 is a block diagram illustrating a nonvolatile memory device according to an example embodiment.

The present invention will now be described more fully with reference to the accompanying drawings, in which some example embodiments are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, although example embodiments will be described as using a phase change random access memory (PRAM), example embodiments can be applied to all kinds of nonvolatile memory devices using a resistive element such as resistive RAM (RRAM) and ferroelectric RAM (FRAM).

FIG. 1 is a block diagram illustrating a nonvolatile memory device according to an example embodiment. In FIG. 1, the nonvolatile memory device 2 may include global bit lines GBL0-GBLn. As shown, the global bit line GBL0 may be coupled to eight local bit lines LBL0-LBL8. Although it is shown that one global bit line GBL0 is coupled with eight local bit lines LBL0-LBL8, it is not limited thereto. The remaining global bit lines may be similarly coupled to corresponding local bit liens and memory cells (not shown).

Referring to FIG. 1, the nonvolatile memory device 2 may include a memory cell array 10, multiple word lines WL0-WLm, the local bit lines LBL0-LBL8, a controller 15 and a row decoder 40. The controller 15 may include a local column selection circuit 20, a global discharge circuit 30 and a local column decoder 50. The controller 15 may also have a pre-charger (not shown).

The memory call array 10 may include a matrix of non-volatile memory cells MC. Rows of the nonvolatile memory cells MC may be coupled with word lines WL0-WLm, respectively, and columns of the nonvolatile memory cells MC may be coupled with the local bit lines LBL0-LBL8, respectively.

Each nonvolatile memory cell MC may include a variable resistive element RC and an access element AC. The variable resistive element RC includes a phase change material that has different resistances according to a crystal state and an amorphous status, and the access element AC that controls current flow in the variable resistive element RC. Here, the access element AC can be a diode or a transistor which may be coupled to the variable resistive element RC in series. Although the diode is illustrated as the access element AC in FIG. 1, the access element AC is not limited thereto. A phase change memory cell that uses a diode as the access device AC is called a diode-controlled phase change memory cell (diode-controlled PRAM cell). Also, the phase change material may include various materials, such as two atomic compounds GaSb, InSb, InSe, $Sb_2Te_3$, or GeTe, three atomic compounds GeSbTe, GaSeTe, InSbTe, $SnSb_2Te_4$, or InSbGe, or four atomic compounds AgInSbTe, (GeSn)SbTe, GeSb(SeTe), $Te_{81}Ge_{15}Sb_2S_2$. GeSbTe which includes germanium Ge, antimony Sb, and tellurium Te may be used.

The nonvolatile memory device 2 may be implemented in a hierarchical bit line structure similar to the nonvolatile memory device according to example embodiments of the present invention. For example, each of the local bit lines LBL0-LBL8 may be selectively coupled to the global bit line GBL0 via the local column selection circuit 20, and each of the local bit lines LBL0-LBL8 may be coupled with each row of multiple nonvolatile memory cells MC. Also, although not shown in the drawing, the word lines can be implemented in a hierarchical word line structure using main word lines and sub word lines.

The local column selection circuit 20 may respond to the local column decoder 50 and couples a selected one of the multiple local bit lines LBL0-LBL8 to the global bit line GBL0. Furthermore, the local column selection circuit 20 may couple a selected one the corresponding local bit lines (not shown) of the remaining global bit lines GBL1-GBLn to the selected local bit line's corresponding global bit line GBL1-GBLn in similar fashion. In FIG. 1, it is illustrated that the local column selection circuit 20 is placed on one side (for example, bottom side); however it is not limited thereto. The local column selection circuit 20 may include local column selection transistors which are respectively coupled with each of the local bit lines LBL0-LBL8.

The global discharge circuit 30 may be placed on one side or both sides of the memory cell array 10 and discharges the global bit line GBL0-GBLn. As shown in FIG. 1, the global discharge circuit 30 is placed on one side (for example, bottom side); however it is not limited thereto. The global discharge circuit 30 may include multiple discharge transistors DCH0-DCHn which are coupled with the global bit lines GBL0-GBLn, respectively.

During an active period, the global discharge circuit 30 may be enabled before a read operation or a write operation, and discharges the global bit line GBL0-GBLn which is coupled with selected nonvolatile memory cells to a certain voltage level, for example, ground voltage VSS. As shown in Table 1 provided below, the global discharge circuit 30 may be selectively disabled during a deep power down period and/or a standby period.

TABLE 1

The operation of global discharge circuit 30 during the deep power down period and/or the standby period.

| | DEEP POWER DOWN | STANDBY |
| --- | --- | --- |
| CASE 1 | Disable | Disable |
| CASE 2 | Disable | Enable |

As shown in CASE 2, the global discharge circuit 30 may be disabled during deep power down period and enabled during the standby period, and as shown in CASE 1 the global discharge circuit 30 may be disabled during both deep power down and standby periods.

Since the level of the global bit lines GBL0 is not the level of ground voltage, the deep power down current and/or the standby current due to reverse current of the access element AC of the nonvolatile memory cell MC can be reduced. Here, the deep power down current may be the current consumed in a nonvolatile memory device during the deep power down period, and standby current may be the current consumed in a nonvolatile memory device during the standby period. This is further described in the following sections using FIGS. 2A through 3B.

Although not illustrated in the drawings, in a nonvolatile memory device according to another example embodiment of the present invention, a local discharge circuit that discharges the local bit lines LBL0-LBL8 may be placed on one side and/or both sides of the memory cell array 10.

The row decoder 40 may control the voltage level of the word lines WL0-WLm to select at least one word line WL0-WLm out of the word lines WL0-WLm. The local column decoder 50 may select at least one local bit line (for example, LBL0) out of multiple local bit lines LBL0-LBL8.

FIGS. 2A through 3B are timing diagrams illustrating the operations of nonvolatile memory device according to example embodiments. To aid in understanding, in FIGS. 2A through 3B a voltage level of global bit line GBL0 is illustrated; however, it should be clear to those skilled in the art that the same voltage level can be applied to any of the global bit lines GBL0-GBLn. Thus, for the sake of clarity and brevity, a discussion of the global bit lines GBL1-GBLn will be omitted.

Figure 2A:
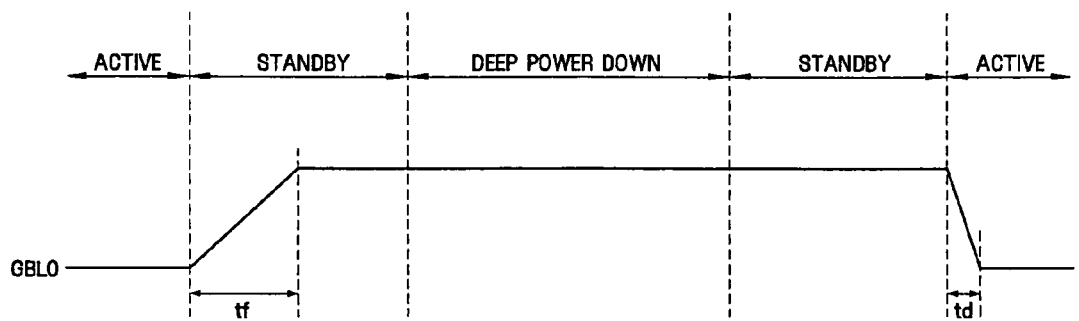
FIGS. 2A through 3B are timing diagrams illustrating the operations of nonvolatile memory device according to an example embodiment.
Figure 2B:
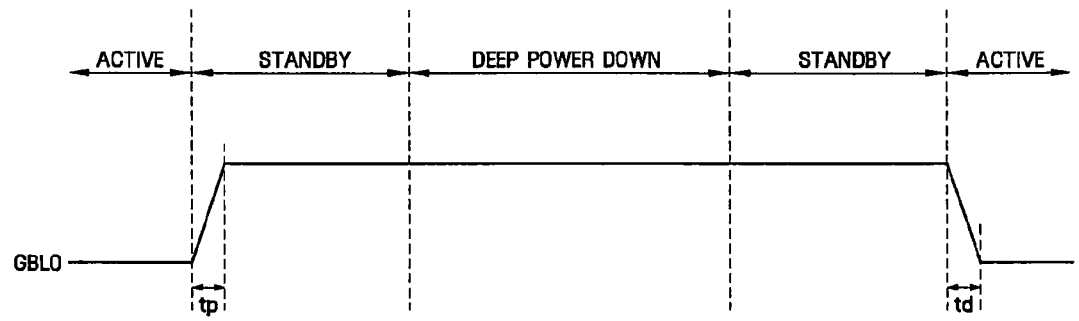

FIGS. 2A and 2B are timing diagrams illustrating example operations of CASE 1 in Table 1 where the global discharge circuit 30 is disabled during both the standby period and the deep power down period.

Referring to FIGS. 1 and 2A, the global discharge circuit 30 may be disabled, and as a result the global bit line GBL0 can be floated during the standby period and the deep power down period. As a time $t_f$ progresses, the local bit lines LBL0-LBL8 and the word line WL0-WLm or the global bit line GBL0 and the word lines WL0-WLm can have the same voltage level due to the reverse current of the access elements AC of the nonvolatile memory cells MC.

During the standby period and the deep power down period, the voltage difference between the local bit lines LBL0-LBL8 and the word lines WL0-WLm or the global bit line GBL0 and the word lines WL0-WLm which are coupled to both ends of the access elements AC of the nonvolatile memory cells MC may be reduced. As a result, the standby current and the deep power down current due to the reverse current of the access elements AC can be reduced. Therefore, since the nonvolatile memory device 2 can reduce the standby current and the deep power down current, the current consumed in nonvolatile memory device 2 can be minimized.

The voltage level of the word lines WL0-WLm during standby period and/or deep power down period may be the source voltage VCC level or a voltage level smaller than the source voltage VCC. More specifically, the voltage level of word lines WL0-WLm during the standby period and/or the deep power down period can be the same as or smaller than the voltage level of a selected one of the word lines WL0-WLm coupled with the nonvolatile memory cells MC during the active period. Here, the reduced voltage level may not be enough to turn on the access element AC of the nonvolatile memory cell MC during the deep power down period. If the access element AC of the nonvolatile memory cell MC is turned on during the deep power down period, undesired data may be written into the variable resistive element RC.

Referring to FIGS. 1 and 2B, in another example embodiment, the global bit line GBL0 may be precharged to a certain voltage level and a global discharge circuit 30 may be disabled during the standby period and the deep power down period. Here, the voltage level to precharge the global bit line GBL0 may be substantially the same as a voltage level of word lines WL0-WLm. The voltage level of the word lines WL0-WLm, as described earlier, can be the source voltage level VCC or a voltage level smaller than the source voltage level VCC. Also, the voltage level of the word lines WL0-WLm may not be high enough to turn on the access elements AC during the standby period and the deep power down period.

A precharge time $t_p$, shown in FIG. 2B, is shorter than the floating time $t_f$. Therefore, the local bit lines LBL0-LBL8 and the word lines WL0-WLm or the global bit line GBL0 and the word lines WL0-WLm in the nonvolatile memory device 2 according to the example embodiment illustrated in FIG. 2B can reach the same voltage level faster compared to the example embodiment illustrated in FIG. 2A. As a result, the standby current and the deep power down current may be reduced more effectively.

Although it is illustrated that the precharge operation of the global bit line GBL0 starts after the start of the standby period, it is not limited thereto. The precharge operation of any of the global bit lines GBL0-GBLn may start before the start of the standby period.

Also, the global bit lines GBL0-GBLn may be precharged to a voltage level during the standby period by a precharge circuit of a read circuit (not shown) coupled to the global bit lines GBL0-GBLn instead of being precharged by the controller 15.

Figure 3A:
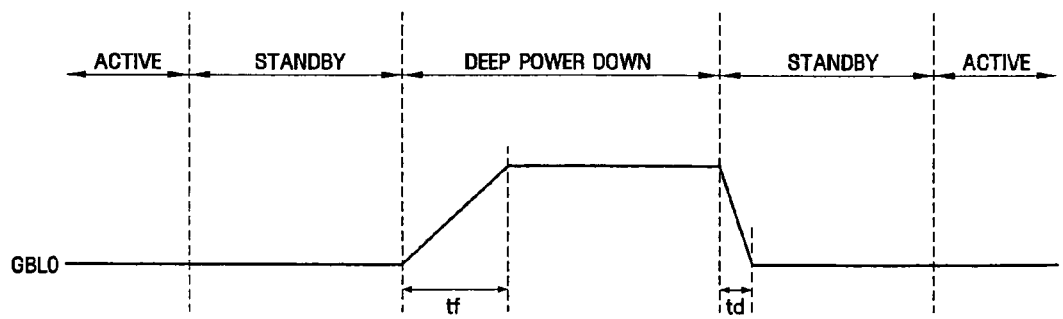
Figure 3B:
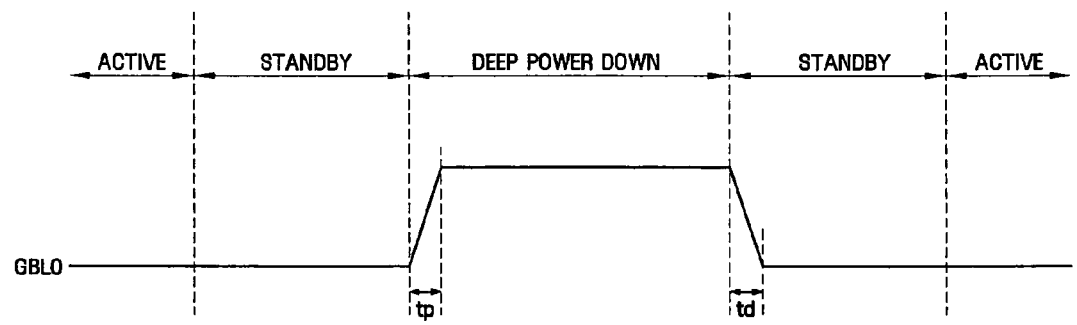

FIGS. 3A and 3B are timing diagrams illustrating example operations of CASE 2 in Table 1 wherein the global discharge circuit 30 may be disabled only during a deep power down period.

Referring to FIGS. 1 and 3A, the global discharge circuit 30 may be disabled during a deep power down period. As a result, the global bit line GBL0 may be floated. Thus, as time progresses, the local bit lines LBL0-LBL8 and the word lines WL0-WLm or the global bit line GBL0 and the word lines WL0-WLm may have a same voltage level due to reverse current of the access elements AC of the nonvolatile memory cells MC.

During the deep power down period, the voltage difference between the local bit lines LBL0-LBL8 and the word lines WL0-WLm or the global bit line GBL0 and the word lines WL0-WLm which are coupled to both ends of the access element AC of the nonvolatile memory cell MC may be reduced. The deep power down current due to the reverse current of the access elements AC may be reduced. Therefore, the nonvolatile memory device 2 may effectively reduce current consumption.

Furthermore, the global bit line GBL0 may be discharged during the standby period and, as a result, the read operation is not delayed during transition from the standby period to the active period. Since the global bit line GBL0 may be discharged during the standby period, the read operation is not delayed.

Referring to FIGS. 1 and 3B, in accordance with another example embodiment, the global bit line GBL0 may be precharged to a certain voltage level during the deep power down period and the global discharge circuit 30 may be disabled. Here, as described earlier, a voltage level which is precharged to the global bit line GBL0 can be substantially the same to the voltage level of the word lines WL0-WLm.

Thus, since the global bit line GBL0 and the word lines WL0-WLm in the nonvolatile memory device according to the example embodiment illustrated in FIG. 3B may reach the same voltage level faster than the nonvolatile memory device according to the example embodiment illustrated in FIG. 3A, the deep power down current may be reduced more effectively. Also, unlike the example embodiment illustrated in FIG. 2B, the global bit line GBL0 may be discharged during the standby period. As a result, the read operation can start without delay during the transition from standby state to active state.

Although it is illustrated that the precharge operation of global bit line GBL0 may start after the start of the deep power down period, it is not limited thereto. The precharge operation of the global bit lines GBL0-GBLn may start before the start of the deep power down period.

Also, the global bit lines GBL0-GBLn may be precharged to a certain voltage level during the deep power down period by a precharge circuit of a read circuit (not shown) coupled to the global bit lines GBL0-GBLn instead of being precharged by the controller 15.

Figure 4:
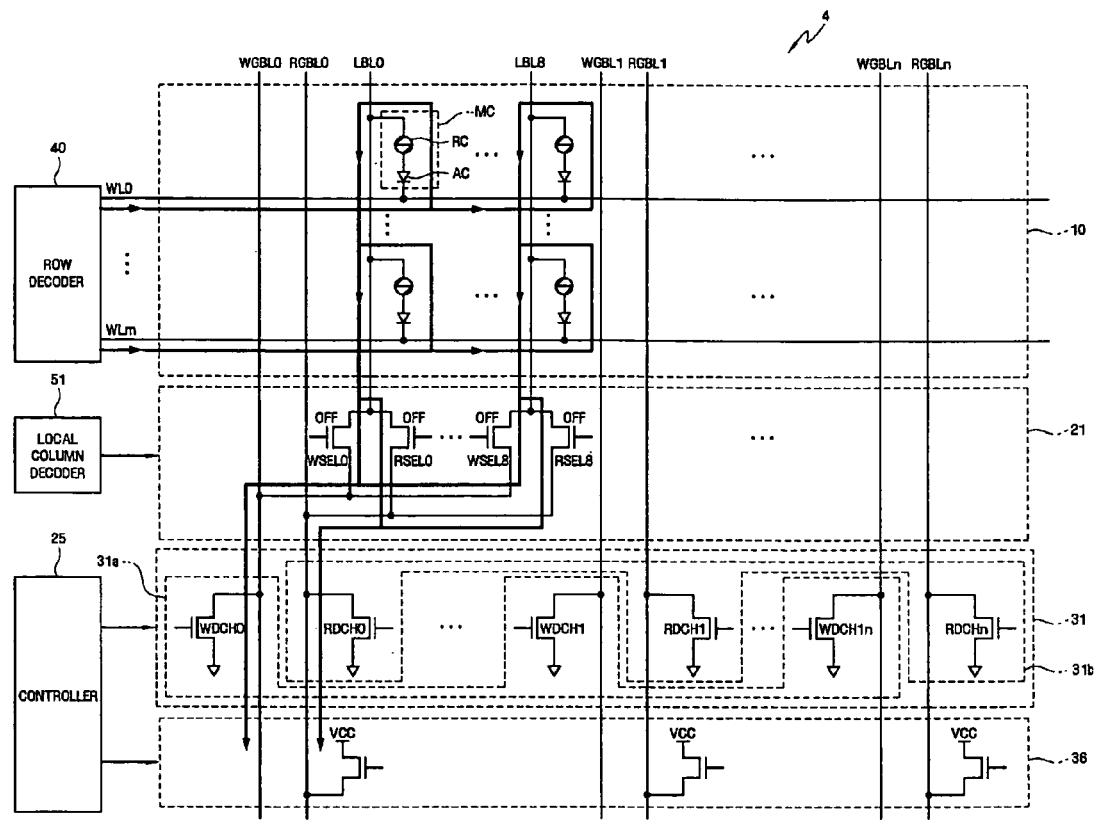
FIG. 4 is a block diagram illustrating a nonvolatile memory device according to another example embodiment.

FIG. 4 is a block diagram illustrating a nonvolatile memory device according to another example embodiment.

Referring to FIG. 4, the nonvolatile memory device 4 may include write global bit lines WGBL0-WGBLn used to supply write data into a memory cell array 10 and read global bit lines RGBL0-RGBLn used to supply read data from the memory cell array 10. Additionally, the nonvolatile memory device may include the row decoder 40 and a controller 25. The controller 25 may include a local column selection circuit 21, a local column decoder 51 and a global discharge circuit 31. The controller 25 may also include a precharger (not shown). When the write global bit lines WGBL0-WGBLn and the read global bit lines RGBL0-RGBLn are included, read while write operations may be performed.

The write global bit line WGBL0 and the read global bit line RGBL0 are selectively coupled with multiple local bit lines LBL0-LBL8 through the local column selection circuit 21. The remaining write global bit lines WGBL1-WGBLn and read global bit lines RGBL1-RGBLn may be similarly coupled to corresponding local bit lines and memory cells (not shown). Each of the local bit lines LBL0-LBL8 may be coupled with the rows of multiple nonvolatile memory cells MC of the memory cell array 10. The local column selection circuit 21 may include multiple write selection registers WSEL0-WSEL8 which are coupled between each local bit line LBL0-LBL8 and the global bit line WGBL0. Multiple read selection registers RSEL0-RSEL8 may be coupled between the local bit lines LBL0-LBL8 and the read global bit line RGBL0.

The global discharge circuit 31 may be placed on one side or both sides of the memory cell array 10. The global discharge circuit 31 may discharge the write global bit lines WGBL0-WGBLn and/or the read global bit lines RGBL0-RGBLn. The global discharge circuit 31 can include a write global discharge circuit 31a and a read global discharge circuit 31b. In FIG. 4, it is illustrated that the global discharge circuit 31 is placed on one side (for example, a bottom side) of the memory cell array 10; however, it is not limited thereto.

The write global discharge circuit 31a may be enabled before a write operation during an active period and discharge the write global bit lines WGBL0-WGBLn which are coupled with a selected one of the nonvolatile memory cells MC to a certain voltage level, for example, ground voltage VSS. Also, the write global discharge circuit 31a may be disabled during a deep power down period and/or a standby period as shown in Table 2 which is provided below.

The read global discharge circuit 31b may be enabled before the read operation during the active period and discharge the read global bit lines RGBL0-RGBLn which are coupled with the selected nonvolatile memory cell MC to a certain voltage level, for example, ground voltage VSS. Also, the read global discharge circuit 31b may be disabled during the deep power down period and/or the standby period as shown in Table 2.

TABLE 2

The operation of write global discharge circuit and read global discharge circuit during the deep power down period and/or the standby period.

|  |  | DEEP POWER DOWN | STANDBY |
|---|---|---|---|
| CASE 1 | WDCH0-WDCHn | Disable | Disable |
|  | RDCH0-RDCHn | Disable | Disable |
| CASE 2 | WDCH0-WDCHn | Disable | Enable |
|  | RDCH0-RDCHn | Disable | Enable |
| CASE 3 | WDCH0-WDCHn | Disable | Disable |
|  | RDCH0-RDCHn | Disable | Enable |
| CASE 4 | WDCH0-WDCHn | Disable | Enable |
|  | RDCH0-RDCHn | Disable | Disable |

Specifically, both the write global discharge circuit 31a and the read global discharge circuit 31b may be disabled during the deep power down period. The write global discharge circuit 31a and the read global discharge circuit 31b may be selectively disabled or enabled during the standby period.

For example, during the standby period both the write global discharge circuit 31a and the read global discharge circuit 31b may be disabled as shown in CASE 1 or enabled as shown in CASE 2. Also, during the standby period as shown in CASE 3 the write global discharge circuit 31a may be disabled and the read global discharge circuit 31b may be enabled, or as shown in CASE 4 the read global discharge circuit 31b may be disabled and the write global discharge circuit 31a may be enabled.

Hereinafter, referring to FIGS. 5 through 8, example operations of CASES 1 through 4 are described in detail. In FIGS. 5 through 8, voltage levels of the write global bit line WGBL0 and the read global bit line RGBL0 are illustrated. However, it should be understood that any write and read global bit line pair (e.g., WGBL1 and RGBL1) may be used. For the sake of brevity and clarity, a discussion of the write global bit lines WGBL1-WGBLn and the read global bits RGBL1-RGBLn will be omitted.

Figure 5:
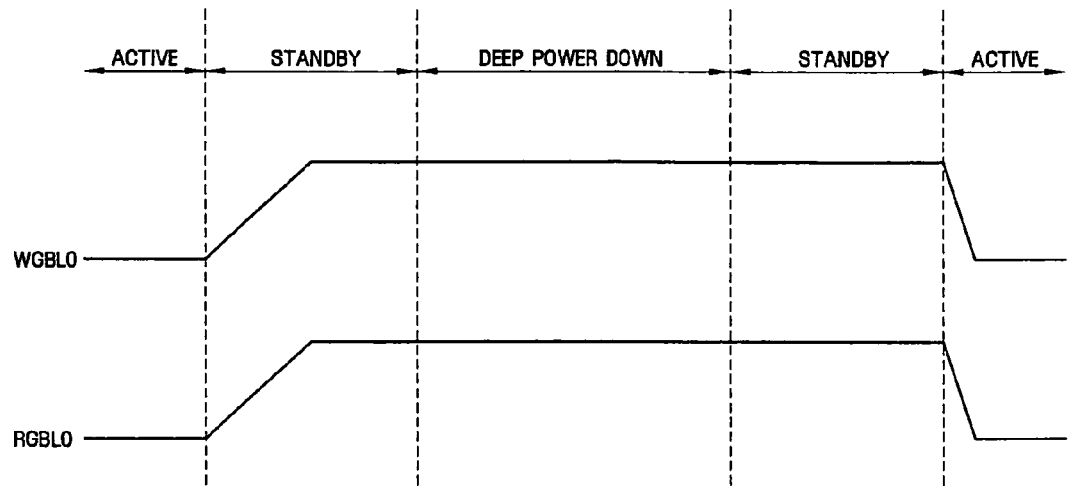
FIGS. 5 through 8 are timing diagrams illustrating operation of the nonvolatile memory device according to another example embodiment.

FIG. 5 is a timing diagram illustrating CASE 1 in Table 2 where the write global discharge circuit 31a and the read global discharge circuit 31b may be disabled.

Referring to FIGS. 4 and 5, the nonvolatile memory device 4 according to the example embodiment illustrated in FIG. 5 may operate in a similar fashion to the nonvolatile memory device 2 according to example embodiment illustrated in FIG. 2A, except the nonvolatile memory device 4 includes the write global bit lines WGBL0-WGBLn and the read global bit lines RGBL0-RBGLn instead of the global bit line GBL0n.

Referring to FIG. 5, the write global discharge circuit 31a and the read global discharge circuit 31b may be disabled during the standby period and the deep power down period and, as a result, the write global bit line WGBL0 and the read global bit line RGBL0 may be floated. Thus, as time progresses, the voltage levels of the write global bit line WGBL0 and the read global bit line RGBL0 may be the same as the voltage level of a word lines WL0-WLm due to reverse current of the access elements AC of the nonvolatile memory cell MC.

During the standby period and the deep power down period, the voltage difference between the write global bit line WGBL0 and the word lines WL0-WLm or the read global bit line RGBL0 and the word lines WL0-WLm which are coupled to both ends of the access elements AC of the nonvolatile memory cells MC may be reduced. Therefore, the standby current and the deep power down current due to the reverse current of the access elements AC may be reduced.

Figure 6:
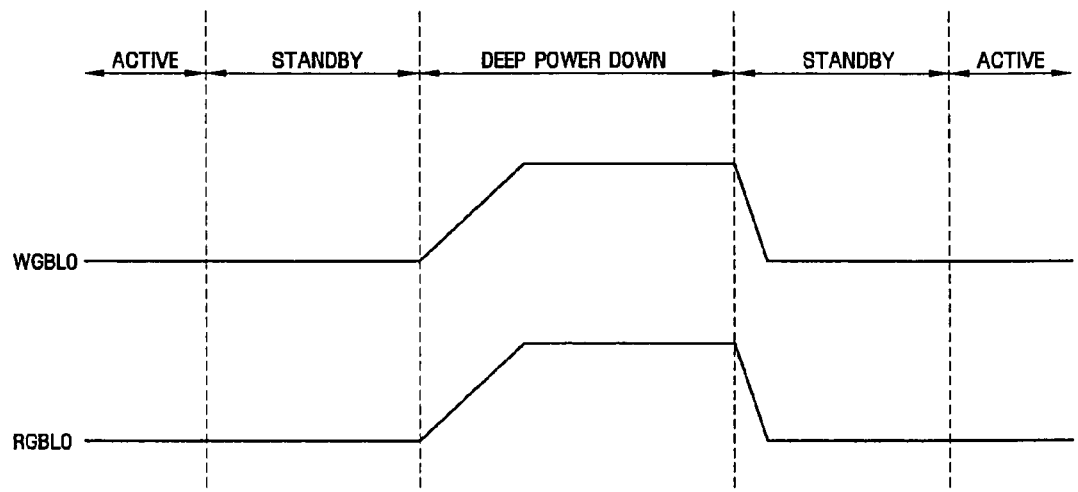

FIG. 6 is a timing diagram illustrating CASE 2 in Table 2 where the write global discharge circuit 31a and the read global discharge circuit 31b may be disabled during the deep power down period and the write global discharge circuit 31a and the read global discharge circuit 31b may be enabled during a standby period.

Referring to FIGS. 4 and 6, the nonvolatile memory device 4 according to an example embodiment illustrated in FIG. 6 may operate in a similar fashion to the nonvolatile memory device 2 according to the example embodiment illustrated in FIG. 3A except that the the write global bit lines WGBL0-WGBLn and the read global bit lines RGBL0-RGBLn are used instead of the global bit lines GBL0-GBLn.

As shown in FIG. 6, the write global discharge circuit 31a and the read global discharge circuit 31b may be disabled during the deep power down period and, as a result, the write global bit line WGBL0 and the read global bit line RGBL0 can be floated. Thus, as time progresses, a voltage level of the write global bit line WGBL0 and the read global bit line RGBL0 may be the same as the voltage level of the word lines WL0-WLm due to reverse current of the access elements AC of the nonvolatile memory cells MC.

During the deep power down period, the voltage difference between the write global bit line WGBL0 and the word lines WL0-WLm or the read global bit line RGBL0 and the word lines WL0-WLm which are coupled to both ends of the access element AC of the nonvolatile memory cell MC may be reduced. As a result, the deep power down current due to reverse current of the access element AC may be reduced. Since both the write global bit line WGBL0 and the read global bit line RGBL0 may be discharged during the standby period, the read operation is not delayed during transition from the standby period to the active period.

Figure 7:
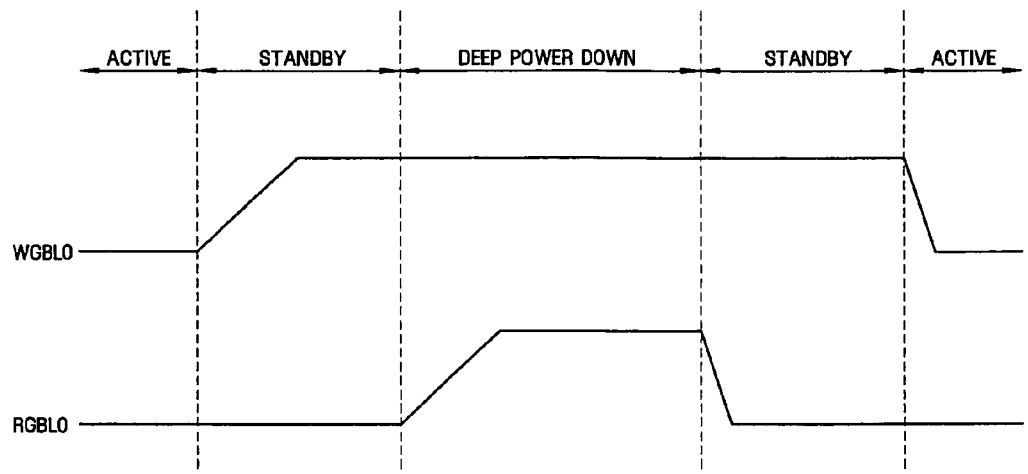

FIG. 7 is a timing diagram illustrating CASE 3 in Table 2 where the write global discharge circuit 31a and read global discharge circuit 31b are disabled during the deep power down period and the write global discharge circuit 31a may be disabled during a standby period.

According to the example embodiment illustrated in FIG. 7, the write global discharge circuit 31a may be disabled during both the standby period and the deep power down period. As a result, the write global bit line WGBL0 can be floated. Thus, during the standby period and the deep power down period, the voltage level of the write global bit line WGBL0 may be the same as the voltage level of the word lines WL0-WLm.

The read global discharge circuit 31b may be disabled only during the deep power down period and read global bit line RGBL0 may be floated. As a result, the read global bit line RGBL0 and the word lines WL0-WLm may have the same voltage level. Also, since the read global discharge circuit 31b may be enabled during the standby period, the read global bit line RGBL0 may be discharged.

Therefore, the nonvolatile memory device 4 can enter the read operation without delay after transitioning from standby state to active state and the standby current and the deep power down current can be further reduced.

More specifically, the nonvolatile memory device 4 can enter the read operation without delay after transitioning from standby state to active state since the read global bit line RGBL0 may be discharged during the standby period. Also, since the global discharge circuit 31a may be disabled during the standby period and the voltage difference between the write global bit line WGBL0 and the word lines WL0-WLm which are coupled to both ends of the access elements AC of the nonvolatile memory cells MC is reduced, standby current consumption through the write global bit line WGBL0 due to the reverse current of the access elements AC may be reduced.

Figure 8:
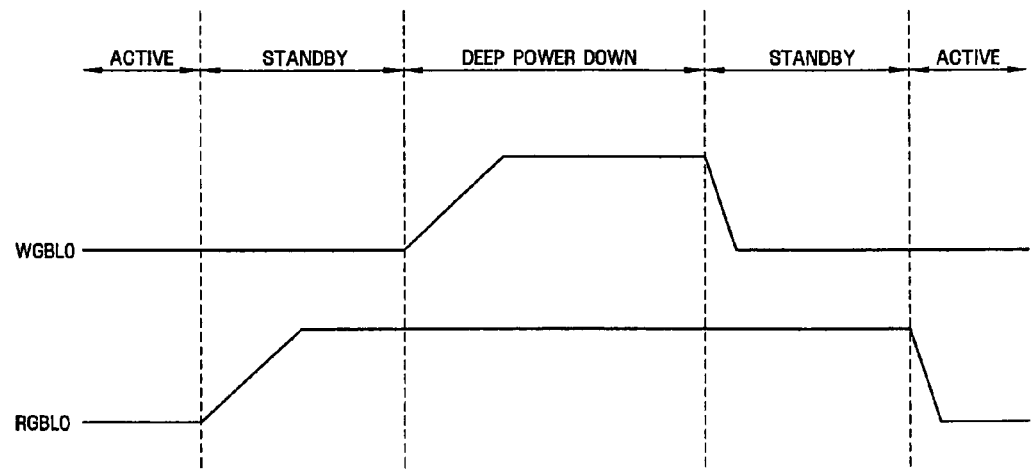

FIG. 8 is a timing diagram illustrating CASE 4 in Table 2 where the write global discharge circuit 31a and the read global discharge circuit 31b may be disabled during the deep power down period and only the read global discharge circuit 31b may be disabled during the standby period.

The read global discharge circuit 31b may be disabled during both the standby period and the deep power down period. As a result, the write global bit line WGBL0 may be floated. Thus, during the standby period and the deep power down period, the voltage level of the read global bit line RGBL0 may be the same as the voltage level of the word lines WL0-WLm.

The write global discharge circuit 31a may be disabled only during deep power down period and the write global bit line WGBL0 may be floated. As a result, the write global bit line WGBL0 and the word lines WL0-WLm may have the same voltage level. Also, since the write global discharge circuit 31a may be enabled during the standby period, the write global bit line WGBL0 may be discharged.

Also, while FIG. 8 illustrates that when the write global discharge circuit 31a and/or the read global discharge circuit 31b are disabled, the write global bit line WGBL0 and/or the read global bit line RGBL0 may be floated and may have the same voltage level as that of the word lines WL0-WLm as time progresses, it is not limited thereto. Specifically, in another example embodiment, when the write global discharge circuit 31a and/or the read global discharge circuit 31b are disabled, the write global bit line WGBL0 and/or the read global bit line RGBL0 may be precharged to a certain voltage level. Here, the voltage level precharged to the write global bit line WGBL0 and/or the read global bit line RGBL0 may be the same as the voltage level of the word lines WL0-WLm.

Figure 9:
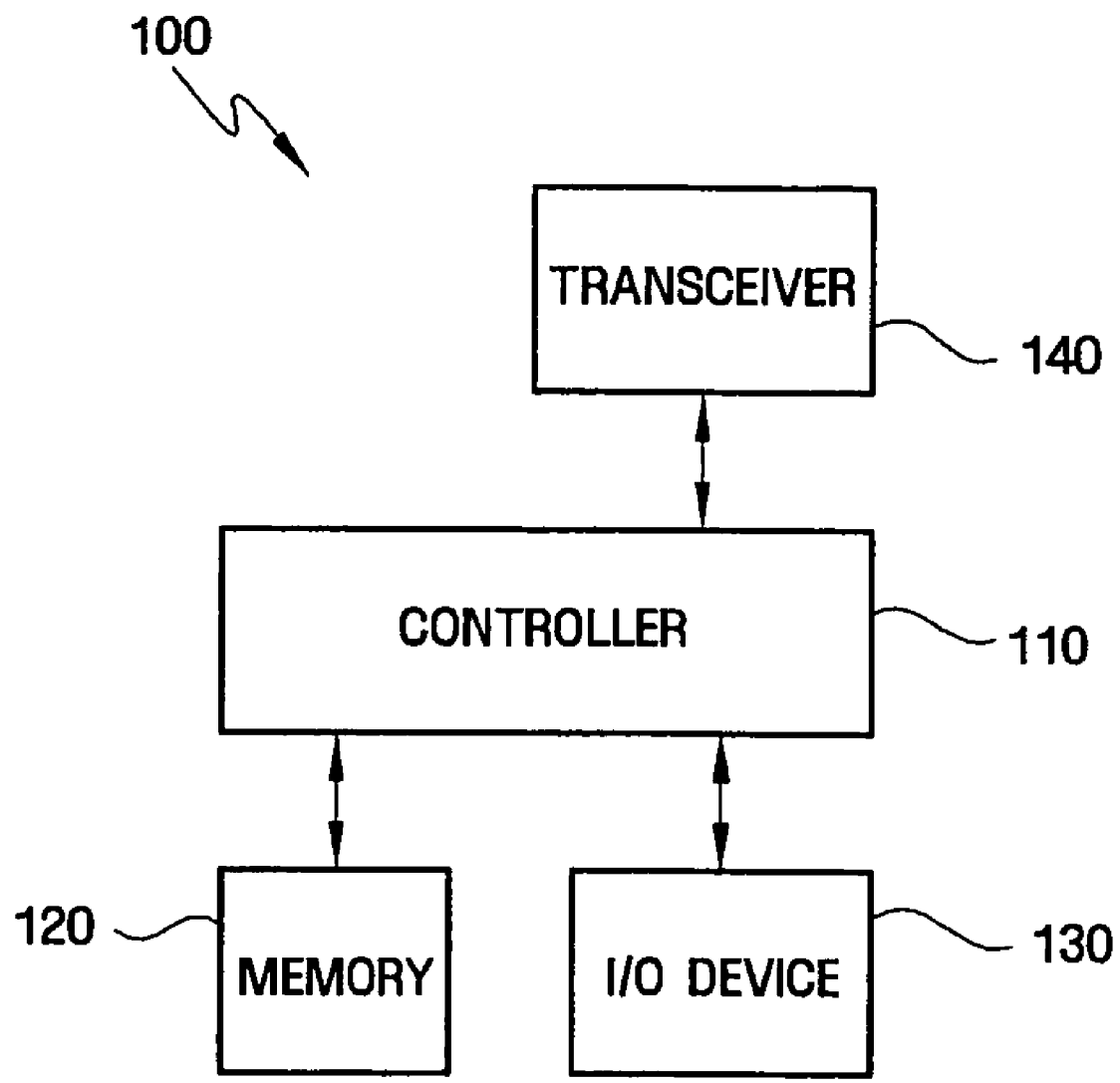
FIG. 9 is a block diagram illustrating a portable media system including the nonvolatile memory device according to example embodiment.

FIG. 9 is a simplified block diagram illustrating a portable media system 100 including the nonvolatile memory device according to example embodiments. In the example embodiment of FIG. 9, a cellular phone is used as an example of the portable media system 100; however, it is not limited thereto. Further embodiments of the portable media system 100 may include a two-way communication system, one way pager, two-way pager, personal communication system, portable computer, Personal Data Assistance (PDA), MP3(MPEG audio layer-3) and digital camera.

Referring FIG. 9, a portable media system 100 including the nonvolatile memory device according to the example embodiments may include a controller 110, a memory 120, an I/O device 130, and a transceiver 140.

The controller 110 can be microprocessors, digital signal processors, or microcontrollers, for example.

The memory 120 may store messages to be delivered to the portable media system 100 or external interfaces. The memory 120 may store instructions and data to be executed by the controller 110 during operations of the portable media system 100. The memory 120 may include more than one different type of memories. For example, the memory 120 can use a nonvolatile memory device, a flash memory device, and/or a nonvolatile memory device such as phase change memory device. Here, the nonvolatile memory device according to the example embodiments can be used as the phase change memory device.

The I/O device 130 may generate messages by user manipulation. The I/O device 130 can include a keypad and a monitor.

The portable media system 100 may transmit or receive messages using wireless communication methods through the transceiver connected to an antenna (not shown). Here, the portable media system 100 may transmit or receive messages using protocols including CDMA (Code Division Multiple Access), GSM (Global System for Mobile communication), NADC (North American Digital Cellular), TDMA (Time Division Multiple Access), ETDMA(Extended TDMA), 3rd generation WCDMA (Wideband CDMA), and CDMA-2000.

While example embodiments have been shown and described with reference to the example embodiments shown in the figures, it will be understood by those of ordinary skill in the art that various changes in form and details may be made therein without departing from the spirit and scope of the present invention as defined by the following claims.

What is claimed is:

1. A nonvolatile memory device comprising:
   a memory cell array including a plurality of nonvolatile memory cells arranged in rows and columns, each of the plurality of memory cells having a variable resistance level depending on data stored therein;
   a plurality of word lines, each of the word lines being coupled with the columns of nonvolatile memory cells;
   a plurality of local bit lines, each of the local bit lines being coupled with the rows of nonvolatile memory cells;
   at least one write global bit line to supply write data to the memory cell array, the at least one write global bit line selectively coupled with the plurality of local bit lines;
   at least one read global bit line to supply read data to the memory cell array, the at least one read global bit line selectively coupled with the plurality local bit lines; and
   a controller configured to permit the at least one write global bit line and the at least one read global bit line to have different voltage levels than each other during a standby period, wherein the controller permits the at least one write global bit line to float and the at least one read global bit line to discharge during the standby period.

2. The nonvolatile memory device of claim 1, wherein the controller permits the at least one write global bit line and the at least one read global bit line to have the same voltage level during a deep power down period.

3. The nonvolatile memory device of claim 2, wherein the controller permits the at least one write global bit line and the at least one read global bit line to float during the deep power down period.

4. The nonvolatile memory device of claim 1, wherein the nonvolatile memory cell is a diode-controlled PRAM cell.

5. A nonvolatile memory device comprising:
   a memory cell array including a plurality of nonvolatile memory cells arranged in rows and columns, each of the plurality of memory cells having a variable resistance level depending on data stored therein;
   a plurality of word lines, each of the word lines being coupled with the columns of nonvolatile memory cells;
   a plurality of local bit lines, each of the local bit lines being coupled with the rows of nonvolatile memory cells;
   at least one write global bit line to supply write data to the memory cell array, the at least one write global bit line selectively coupled with the plurality of local bit lines:
   at least one read global bit line to supply read data to the memory cell array, the at least one read global bit line selectively coupled with the plurality local bit lines; and
   a controller configured to permit the at least one write global bit line and the at least one read global bit line to have different voltage levels than each other during a standby period, wherein the controller precharges the at least one write global bit line to a voltage level of at least one of the plurality of word lines and discharges the at least one read global bit line during the standby period.

* * * * *